United States Patent [19]
Imanaka

[11] Patent Number: 5,838,699
[45] Date of Patent: Nov. 17, 1998

[54] LINE MEMORY CIRCUIT

[75] Inventor: Yoshifumi Imanaka, Kanagawa, Japan

[73] Assignee: Mitsubishi Denki Kabushiki Kaisha, Tokyo, Japan

[21] Appl. No.: 897,001

[22] Filed: Jul. 18, 1997

Related U.S. Application Data

[63] Continuation of Ser. No. 524,905, Sep. 7, 1995, abandoned.

[30] Foreign Application Priority Data

Apr. 28, 1995 [JP] Japan .................................... 7-105321

[51] Int. Cl.$^6$ ...................................................... G06F 7/02
[52] U.S. Cl. .......................................... 371/68.2; 371/21.1
[58] Field of Search ................................. 371/68.2, 67.1, 371/21.1, 21.2, 40.1, 51.1, 24, 25, 40.11, 61, 71; 395/185.07, 183.18; 364/265.3, 266.4, 944.92; 365/201, 194, 189.04, 189.01; 711/170, 171, 172

[56] References Cited

U.S. PATENT DOCUMENTS 4,726,021  2/1988  Horigachi et al. ......................... 371/38
5,263,029  11/1993  Wicklund, Jr. .......................... 371/21.1
5,376,971  12/1994  Kandons et al. ......................... 348/699
5,646,694  7/1997  Horita et al. ............................. 348/448

FOREIGN PATENT DOCUMENTS 0365114  4/1990  European Pat. Off. .

*Primary Examiner*—Trinh L. Tu
*Attorney, Agent, or Firm*—Oblon, Spivak, McClelland, Maier & Neustadt, P.C.

[57] ABSTRACT

A line memory circuit is provided which simultaneously carries out line memory writing and line data comparison in order to improve high speed processing. The line memory circuit of the present invention has an information bit (line match/mismatch bit) encoded at the head of each line in the line memory circuit used in an encoding circuit, wherein encoding of a picture element data of the line is avoided when a matching result is obtained. In the line memory circuit, input picture element data are stored into a line memory, and the input data are sequentially compared with picture element data on the preceding line stored in the line memory. Picture element data on the preceding line are sequentially encoded during the next line. The line memory circuit completes encoding of input picture element data during a subsequent line where picture element data are inputted, which enables high speed encoding of the input picture element data.

10 Claims, 14 Drawing Sheets

SECOND PARTITION

| IN | | OUT | |
|---|---|---|---|
| W-REQ | R-REQ | W-ACK | R-ACK |
| 0 | 0 | 0 | 0 |
| 0 | 1 | 0 | 1 |
| 1 | 0 | 1 | 0 |
| 1 | 1 | 1 | 0 |

FIG. 3

FIRST PARTITION

SECOND PARTITION

SECOND PARTITION

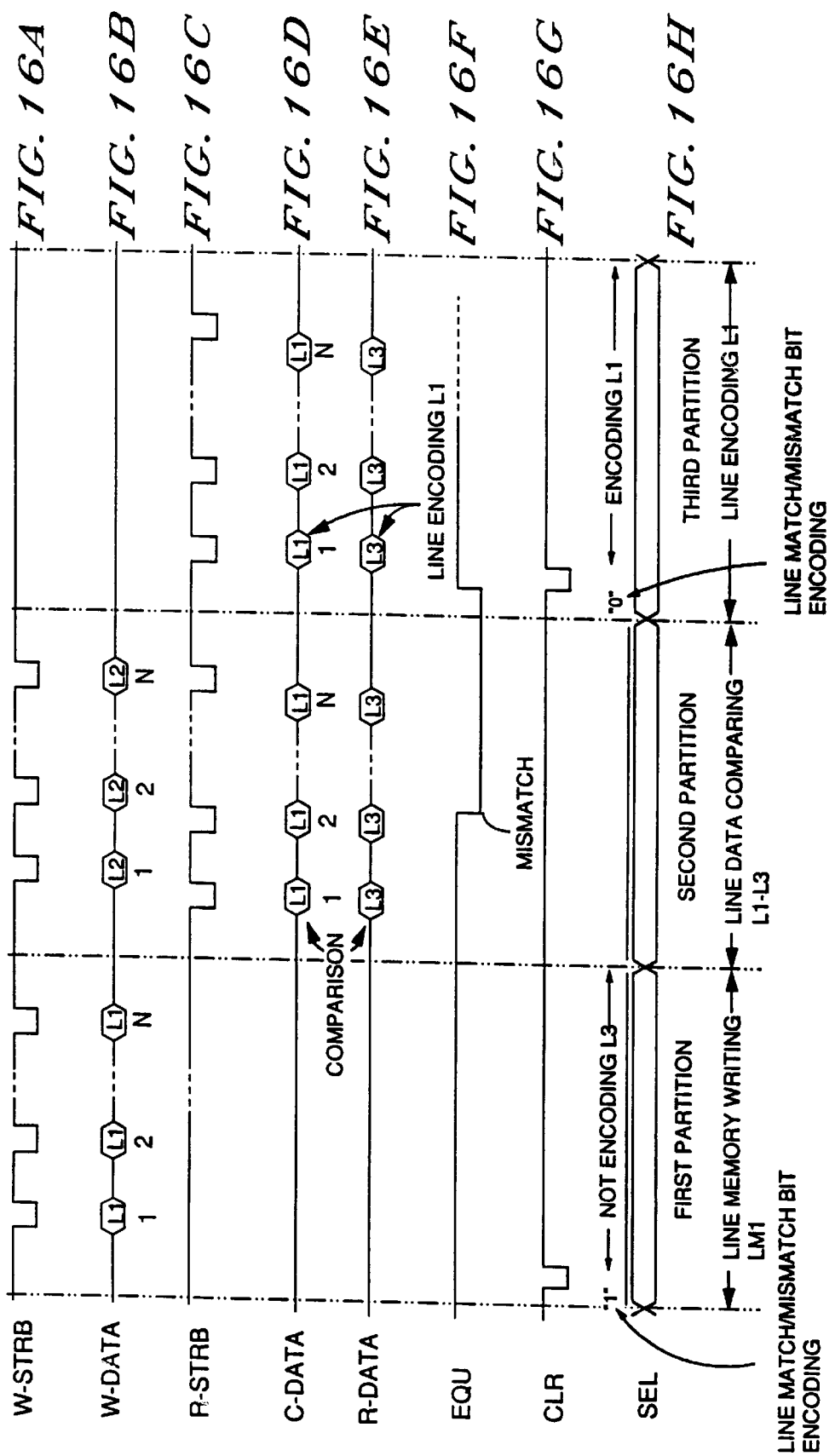

LINE MEMORY CIRCUIT

This application is a Continuation of application Ser. No. 08/524,905, filed on Sep. 7, 1995, now abandoned.

BACKGROUND OF THE INVENTION

1. Field of the Invention

The invention relates to a line memory circuit which is necessarily used for coding facsimile pictures and so on.

2. Description of the Prior Art

FIG. 7 is a conventional circuit diagram of a facsimile apparatus to explain a location of a line memory circuit of the present invention. In FIG. 7, a picture placed on a scanner 1 is read by a reading circuit 2 and encoded by an encoding circuit 3. Then the encoded data are transmitted to memory 4 to be further transmitted from a communication control circuit 5 to a communication line 6.

FIG. 8 shows a picture element arrangement on a picture display. FIG. 9 shows a state of a line match/mismatch bit (identification bit). As shown in FIG. 8, facsimile pictures are encoded for every picture element of a line from the left top of a display. In order to improve encoding efficiency and speed-up of the processing, an identification bit (line match/mismatch bit) is provided for each line which shows whether a certain line is totally in accord with a preceding line as shown in FIG. 9.

If the line is totally in accord with the preceding line, the encoding of the line is skipped. In FIG. 9, since the lines 1, 2, 4 and 6 are not in accord with preceding lines, respectively, a line match/mismatch bit at the head of the line is set to "0" and data of the picture element in the line followed by the identification bit "0" are encoded. Alternatively, since the lines 3 and 5 are in completely accord with the preceding lines, respectively, the respective identification bits of these lines become "1" and the picture element data of these line are not encoded.

FIG. 10 shows encoding picture elements and reference picture elements. As shown in FIG. 10, each picture element x on the encoding picture line is encoded by referring to the encoded picture elements already encoded. For example, two picture elements just before the picture element x in the same encoding line and five picture elements on the preceding reference line are selected as reference picture elements as shown in FIG. 10.

FIG. 11 shows an example of a conventional encoding circuit. A line memory circuit 31 comprises a line memory which stores picture element data of several lines and a determination circuit to determine whether a line is in accord with the preceding line. An encoder 32 carries out encoding according to picture element data inputted from the line memory circuit 31 and line match/mismatch bit. A line controller 33 sends a switching signal to the line memory circuit 31 and the encoder 32 for every line.

FIG. 12 is a block diagram of a conventional line memory circuit. FIG. 16 shows a timing-chart of an operation of a conventional line memory circuit. In FIG. 12, LM1 to LM3 are line memories which store picture element data for respective lines, SEL 1 is a selector for selecting to which line memory the input picture element data are written, SEL 2 is a selector for selecting from which line memory the picture element data on the encoding line and the reference line are read out. W-CNT is an address counter for generating addresses of the line memory to be written in, R-CNT is an address counter for generating addresses of the line memory to be read out. SEL 3 is a selector for selecting to which line memory the written address and the read-out address are connected. CMP is a comparator for comparing the picture element data on two lines and for generating a bit "1" as a result of mismatch thereof. EQU-FF is a line match/mismatch bit generating circuit which generates a line match/mismatch bit.

FIG. 16 shows a timing-chart of an operation of a conventional line memory circuit. An operation of a conventional line memory circuit 31 is now explained below. In FIG. 16, a line process is divided into the following three partitions.

First partition (FIG. 13):

FIG. 13 is an operation block diagram of a line memory circuit at a first timing-chart partition of a conventional line memory circuit. In FIG. 13, C and Y1 are connected in SEL1 and C1 and Y1 are connected in SEL3. A writing strobe W-STRB writes input picture element data (L1) on W-DATA into the line memory LM1. After N picture element data (L1) for one line is written into the line memory LM1 in the first partition, the states moves to a second partition where line data are compared between L1 and L2.

Second partition (FIG. 14):

FIG. 14 is an operation block diagram of a line memory circuit at a second timing-chart partition of a conventional line memory circuit. In FIG. 14, C2 is connected with Y1 and Y3 in SEL3, and read-out address from R-CNT is supplied to the line memory LM1 and the line memory LM3. Thereby, the two line picture element data which are already written in the line memory LM1 and the line memory LM3, respectively, are read out. In SEL2, C1 is connected with Y1, and C3 is connected with Y2. Thereby, picture element data of LM1 (L1) are supplied to a terminal A of a comparator CMP and picture element data (L3) of LM3 are supplied to a terminal B of a comparator CMP to be compared. A comparison is carried out sequentially for every line (N picture elements). As shown in a sign "mismatch" in FIG. 16, if there is at least one of the mismatch picture element in one line, EQU signal from EQU-FF becomes "0", which indicates that the line comparison is mismatched. On the other hand, in the second partition, C1 is connected with Y2 in SEL3 and C is connected with Y2 in SEL1, then picture element data of the following line is written into a following line memory LM2.

Third partition (FIG. 15):

FIG. 15 is an operation block diagram of a line memory circuit at a third timing-chart partition of a conventional line memory circuit. In this third partition, C2 is connected with Y1 and Y3 in SEL3 and C1 is connected with Y1 and C3 with Y2 in SEL2. Picture element data (L1) are read out to C-DATA as encoding data and picture element data (L3) is read out to R-DATA as a reference line data and a picture element data (L1) is encoded by the next stage encoder 32.

In this third partition, identification bit "0 (mismatch)" or "1 (match)" are encoded by the EQU signal which shows that lines are matched or mismatched. When the lines are not matched, that is, in case of "0", remaining picture elements following the "0" bit in the same line are encoded.

Since a conventional method needs a second partition which only compares line data, processing speed has been slowed down.

SUMMARY OF THE INVENTION

It is an object of the present invention to provide a line memory circuit wherein a line memory writing process, a line data comparing process and a line encoding process can be carried out at the same time so as to improve the speed of total encoding processes.

It is further object of the present invention to provide a line memory circuit wherein the chances for collision of writing in and reading out the arbitration circuit ARBT can be avoided, waiting time can be reduced and the high speed process can be obtained.

According to one aspect of the present invention, a line memory circuit has an information bit (line match/mismatch bit) encoded at the head of each line in said line memory circuit used in an encoding circuit, wherein encoding of a picture element data of the line is avoided when matching result is obtained. The line memory circuit comprises; a line memory for writing input picture element data of i-th line; a comparator for sequentially comparing current picture element data on i-th line with preceding picture data on (i−1)th line; a match/mismatch bit generating circuit for generating match/mismatch bits which indicate whether i-th line matches with (i−1)th line or not; an encoding circuit for encoding picture element data on i-th line while inputting input picture element data on a subsequent (i+1)th line.

According to a further aspect of the present invention, a line memory circuit further comprises an arbitration circuit ARBT, the arbitration circuit ARBT arbitrates a request W-REQ for writing input picture element data into a line memory with a request R-REQ for reading and encoding picture element data stored in a line memory, then carries out an access control of the line memory so that a priority is given to any one of requests when both requests occur simultaneously.

According to a further aspect of the present invention, the comparator in the line memory circuit compares picture element data on the current i-th line with picture element data on the preceding (i−1)th line after the arbitration circuit gives a permission to the picture element input and also at the time when the picture element data are written into the line memory.

According to a further aspect of the present invention, the comparator of the line memory circuit sequentially compares picture element data on i-th line with those on the preceding (i−1)th line while picture element data of i-th line are inputted so that a comparison between the picture element data of i-th line and those of a preceding (i−1)th line is completed when all picture element data of i-th line are written in the line memory.

According to a further aspect of the present invention, a line memory circuit comprises a plurality of line memories for writing input picture element data, a first selector for selecting a line memory for writing input picture element data, a third selector for providing addresses of said line memory, a second selector for selectively providing a data stored in said line memory to a comparator, the comparator for comparing current data with data read out from said second selector, a line match/mismatch bit generator for generating "line match/mismatch bits" in response to a result of said comparator, said line memory circuit has an information bit (line match/mismatch bit) encoded at the head of each line in said line memory circuit used in an encoding circuit, wherein encoding of a picture element data of the line is avoided when matching result is obtained, wherein one input of said comparator is connected with input picture element data W-DATA terminal; another input of said comparator is connected with an output of the second selector; and the third selector is controlled by writing timing W-STRB of input picture element data to the line memory.

According to a further aspect of the present invention, a line memory circuit further comprises an arbitration circuit ARBT, the arbitration circuit ARBT gives a priority to any one of the requests when a request W-REQ for writing input picture element data into a line memory or a request R-REQ for reading and encoding picture element data stored in a line memory are inputted simultaneously.

BRIEF DESCRIPTION OF THE DRAWINGS

FIG. 3 shows an operation logic of ARBT in line memory circuit of an embodiment of the present invention.

FIG. 16 shows a timing-chart of an operation of a conventional line memory circuit.

DETAILED DESCRIPTION OF THE PREFERRED EMBODIMENTS

Figure 1:
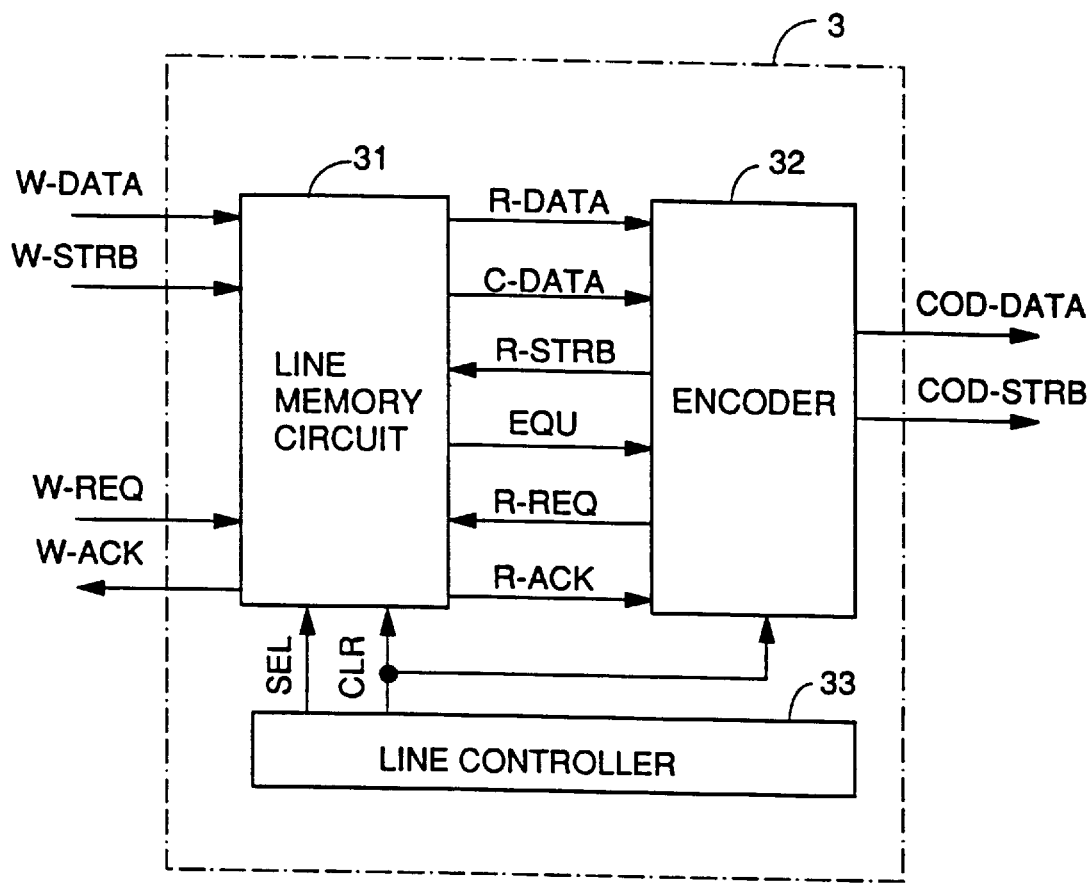
FIG. 1 is a block diagram of an encoding circuit of an embodiment of the present invention.
Figure 2:
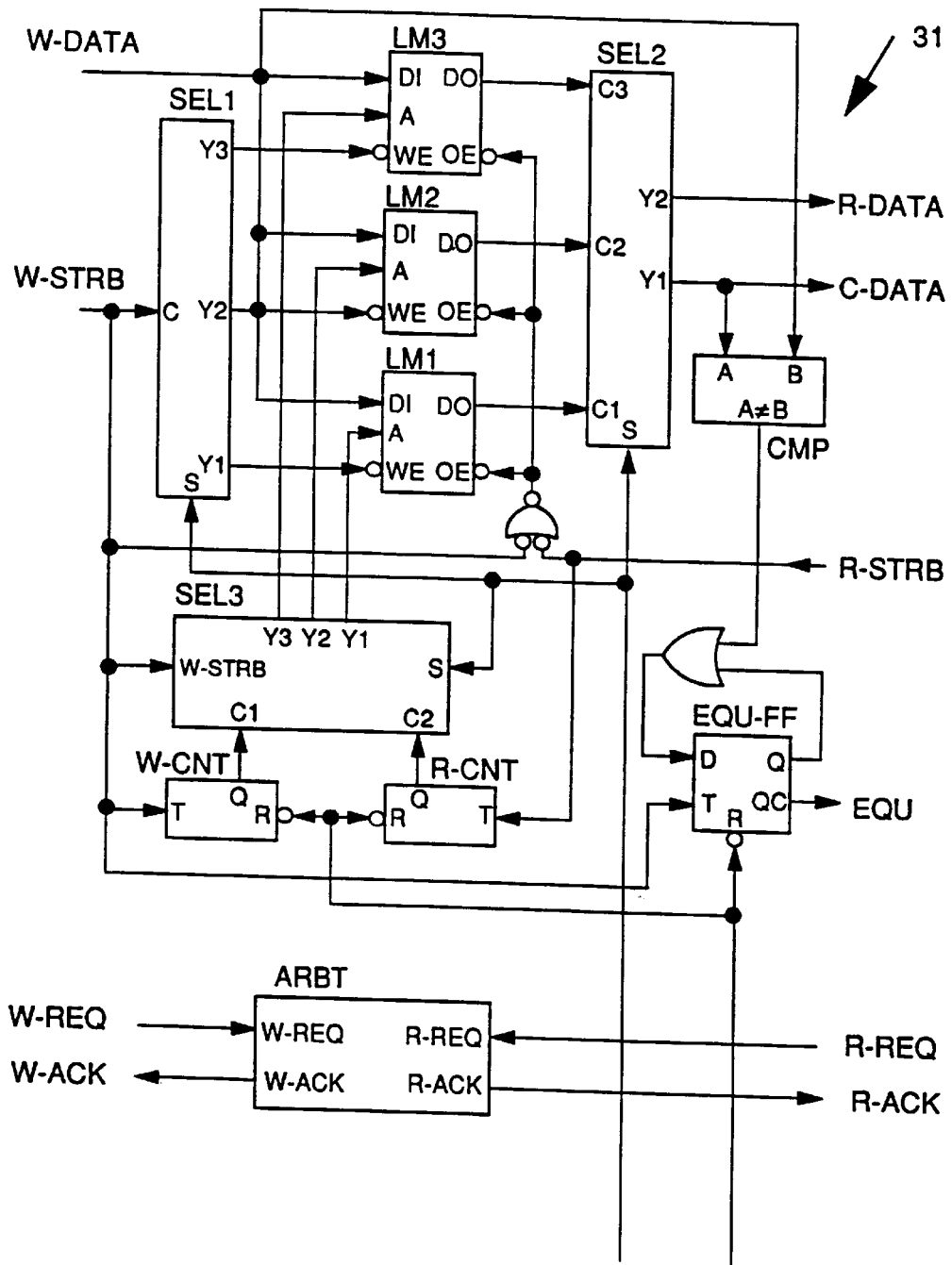
FIG. 2 is a block diagram of a line memory circuit of an embodiment of the present invention.
Figure 6:
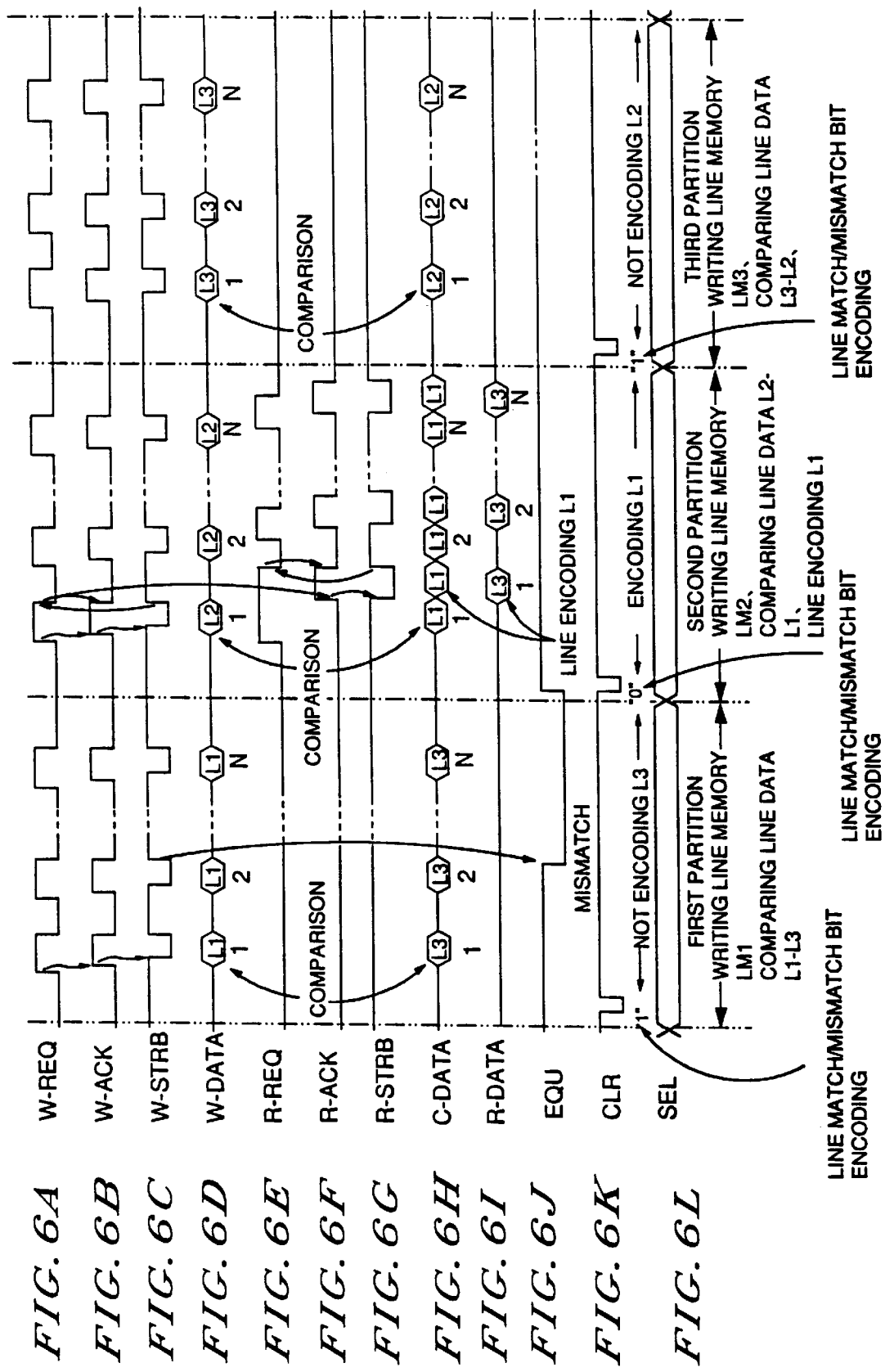
FIG. 6 shows a timing-chart of an operation of a line memory circuit of the present invention.
Figure 7:
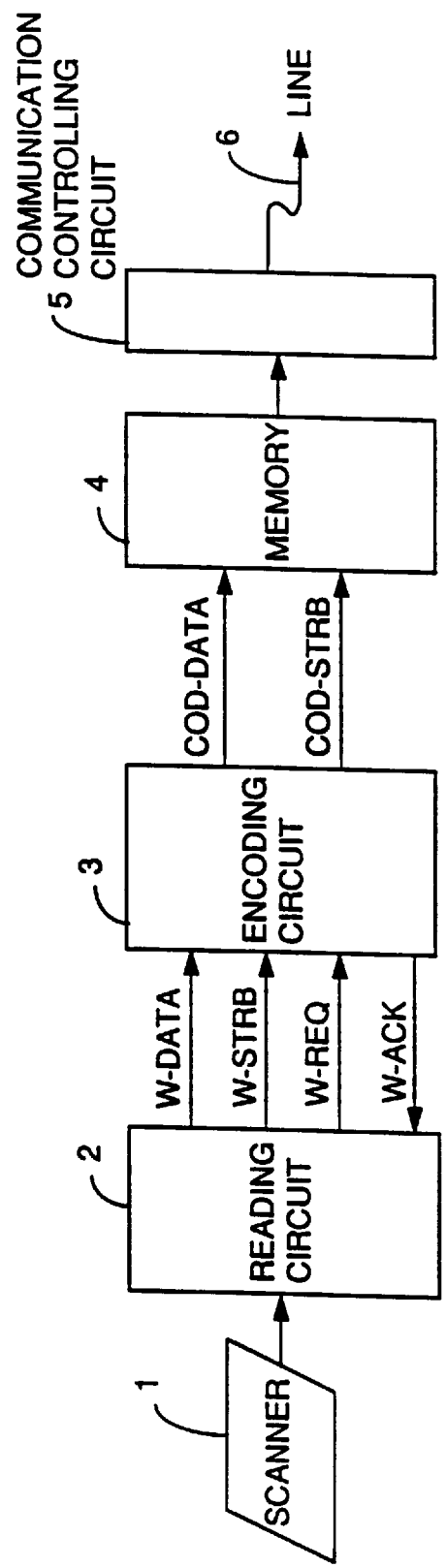
FIG. 7 shows a conceptual construction of a facsimile apparatus.
Figure 8:
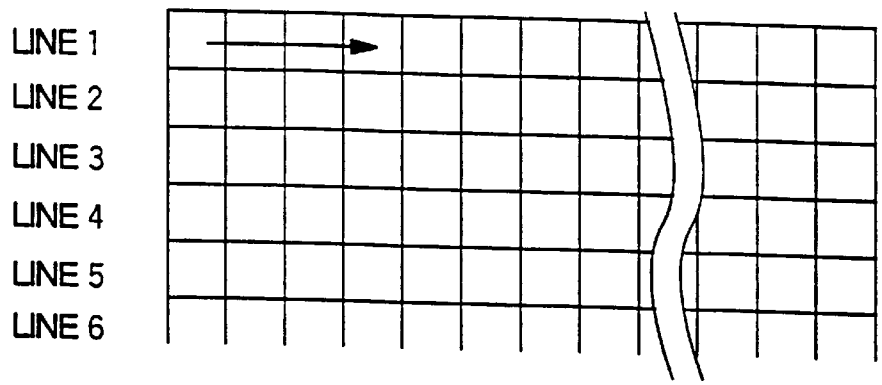
FIG. 8 shows a picture element arrangement on a picture display.
Figure 9:
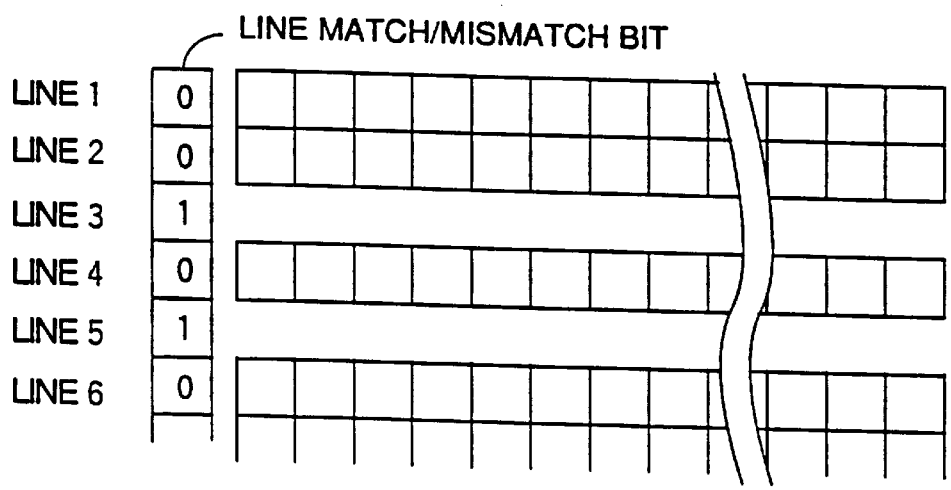
FIG. 9 shows a state of line match/mismatch bits (identification bits).
Figure 10:
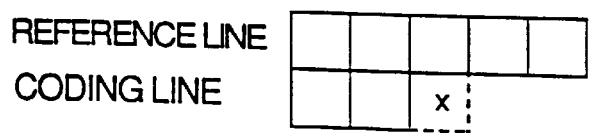
FIG. 10 shows encoding picture elements and reference picture elements.

FIG. 1 is a block diagram of an encoding apparatus of an embodiment of the present invention. FIG. 2 is a block diagram of a line memory circuit of an embodiment of the present invention. FIG. 6 shows a timing-chart of an operation of a line memory circuit of the present invention.

Figure 11:
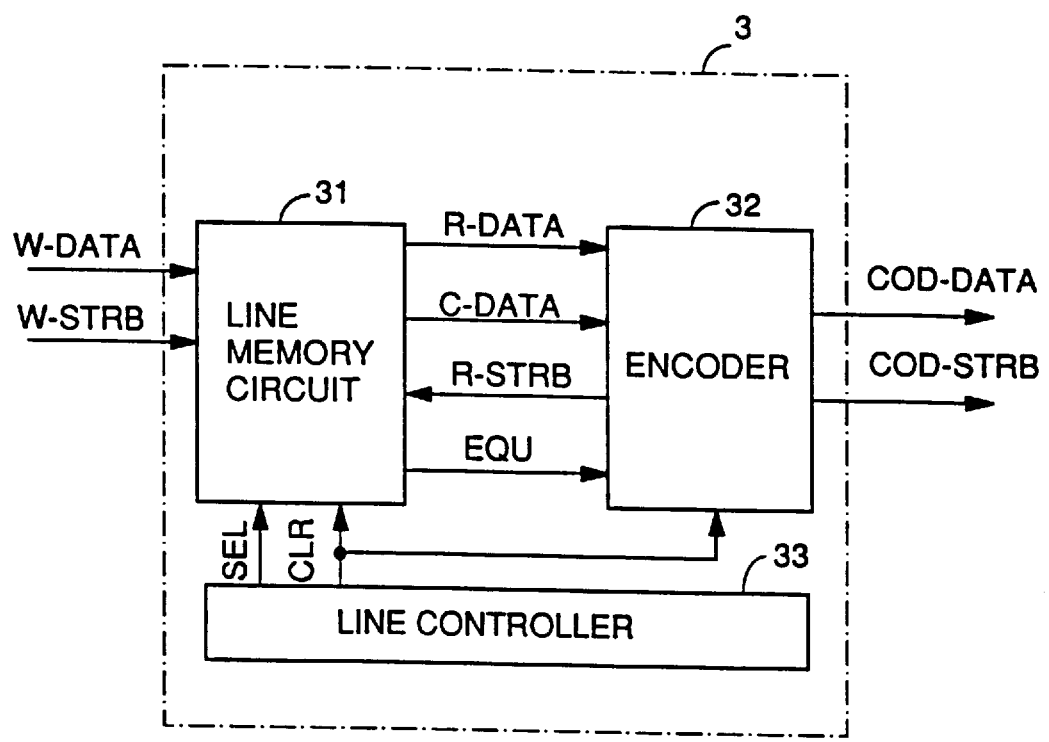
FIG. 11 shows an example of a conventional encoding circuit.
Figure 12:
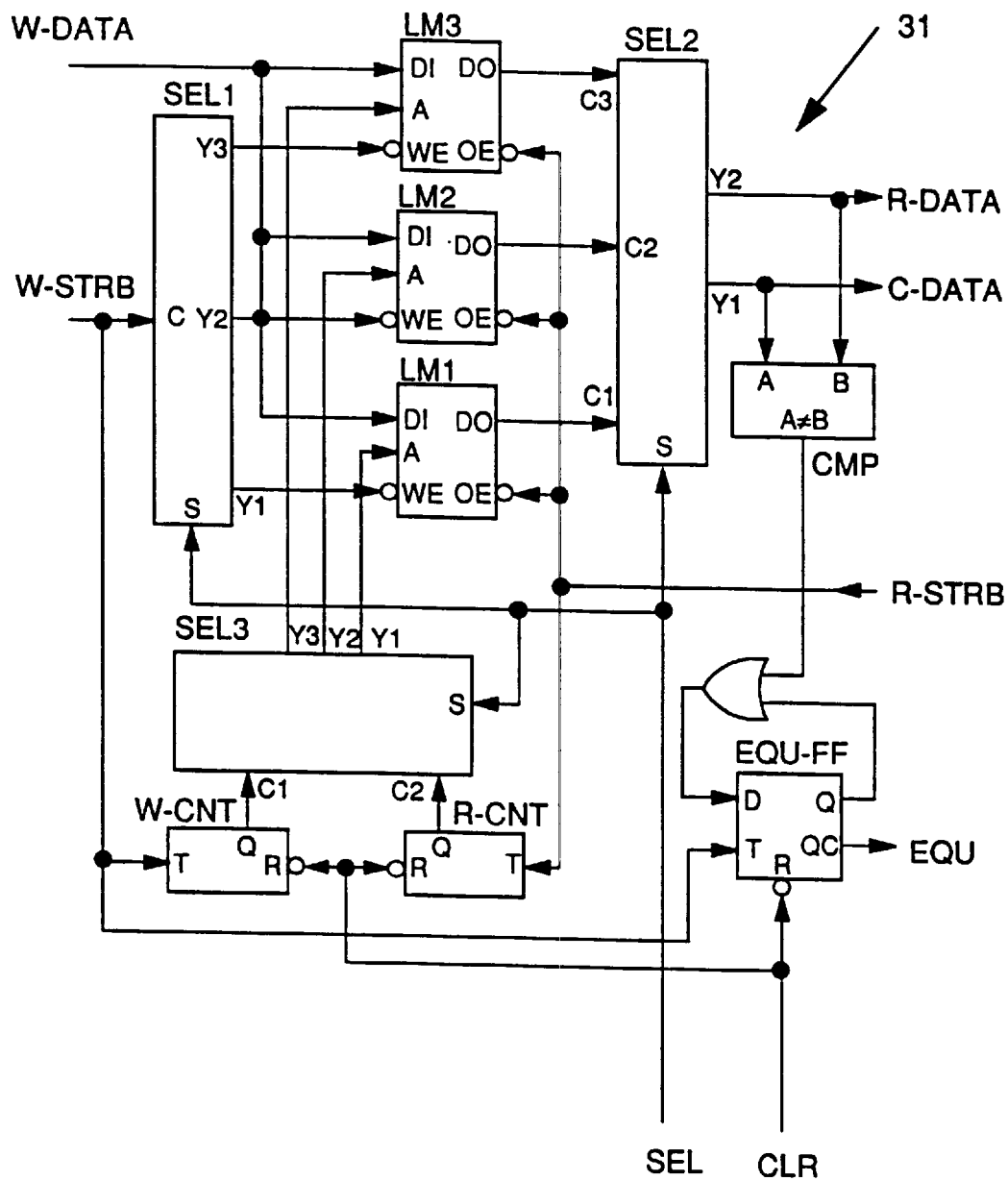
FIG. 12 is a block diagram of a conventional line memory circuit.
Figure 13:
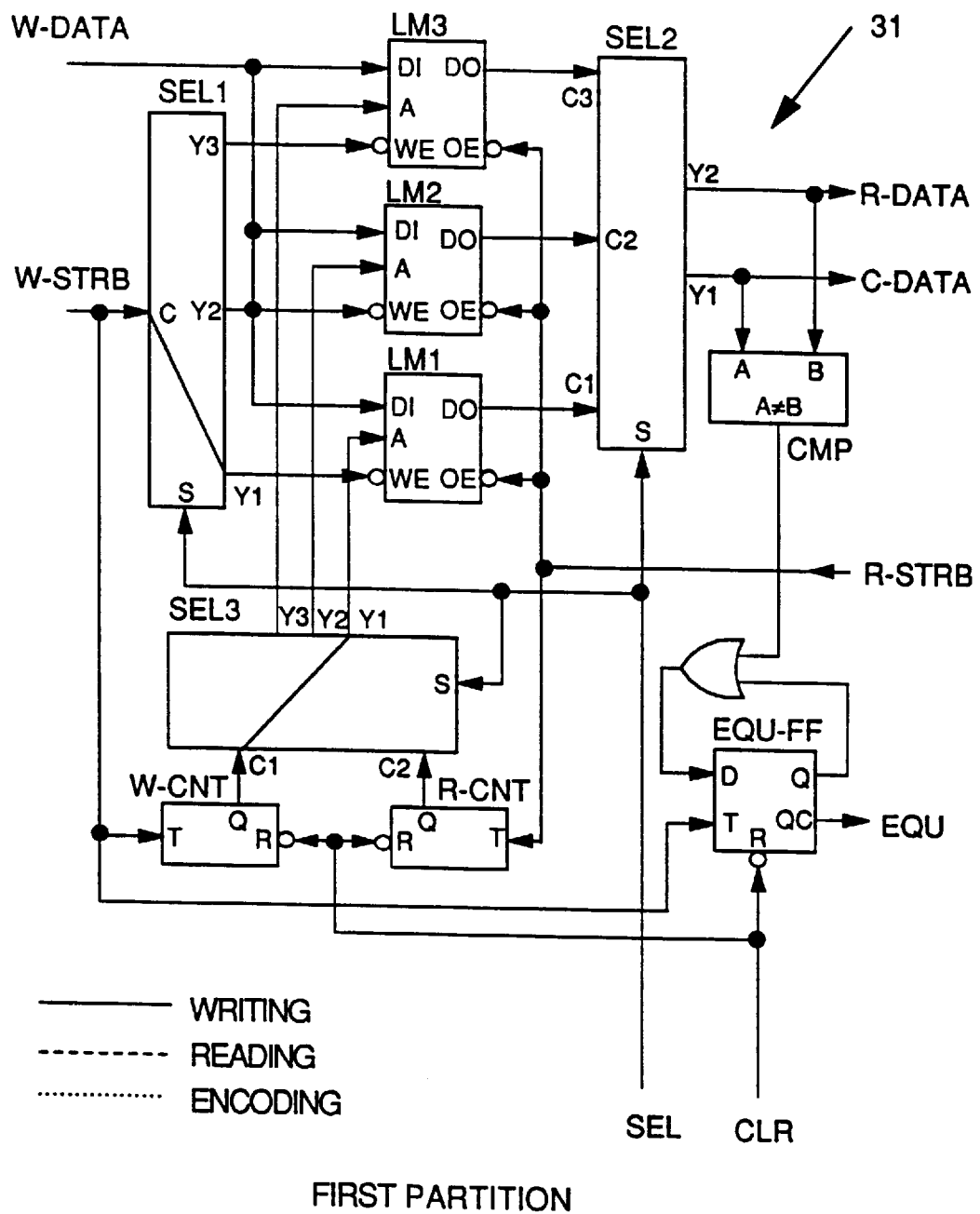
FIG. 13 is an operation block diagram of a line memory circuit at a first timing-chart partition of a conventional line memory circuit.
Figure 14:
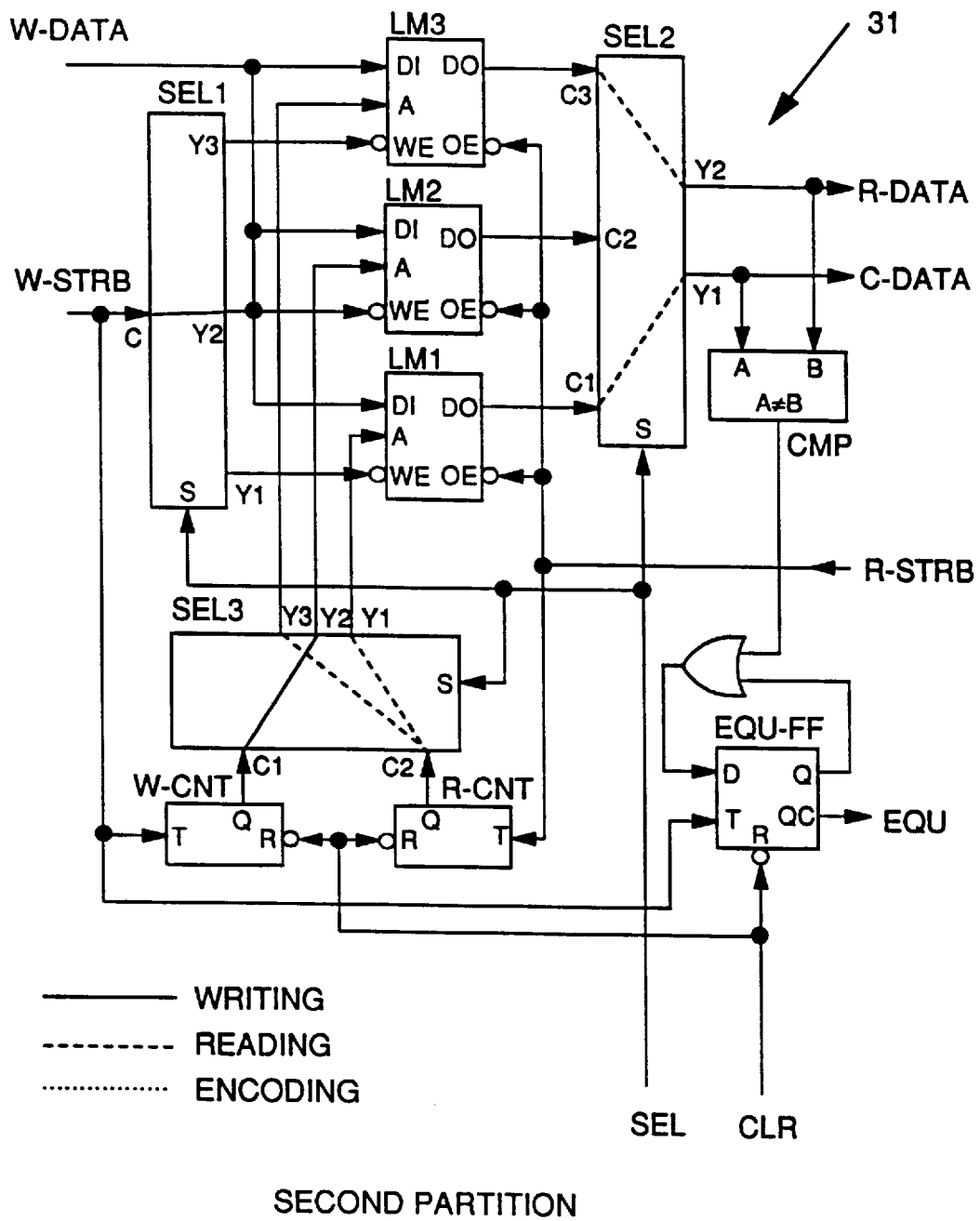
FIG. 14 is an operation block diagram of a line memory circuit at a second timing-chart partition of a conventional line memory circuit.
Figure 15:
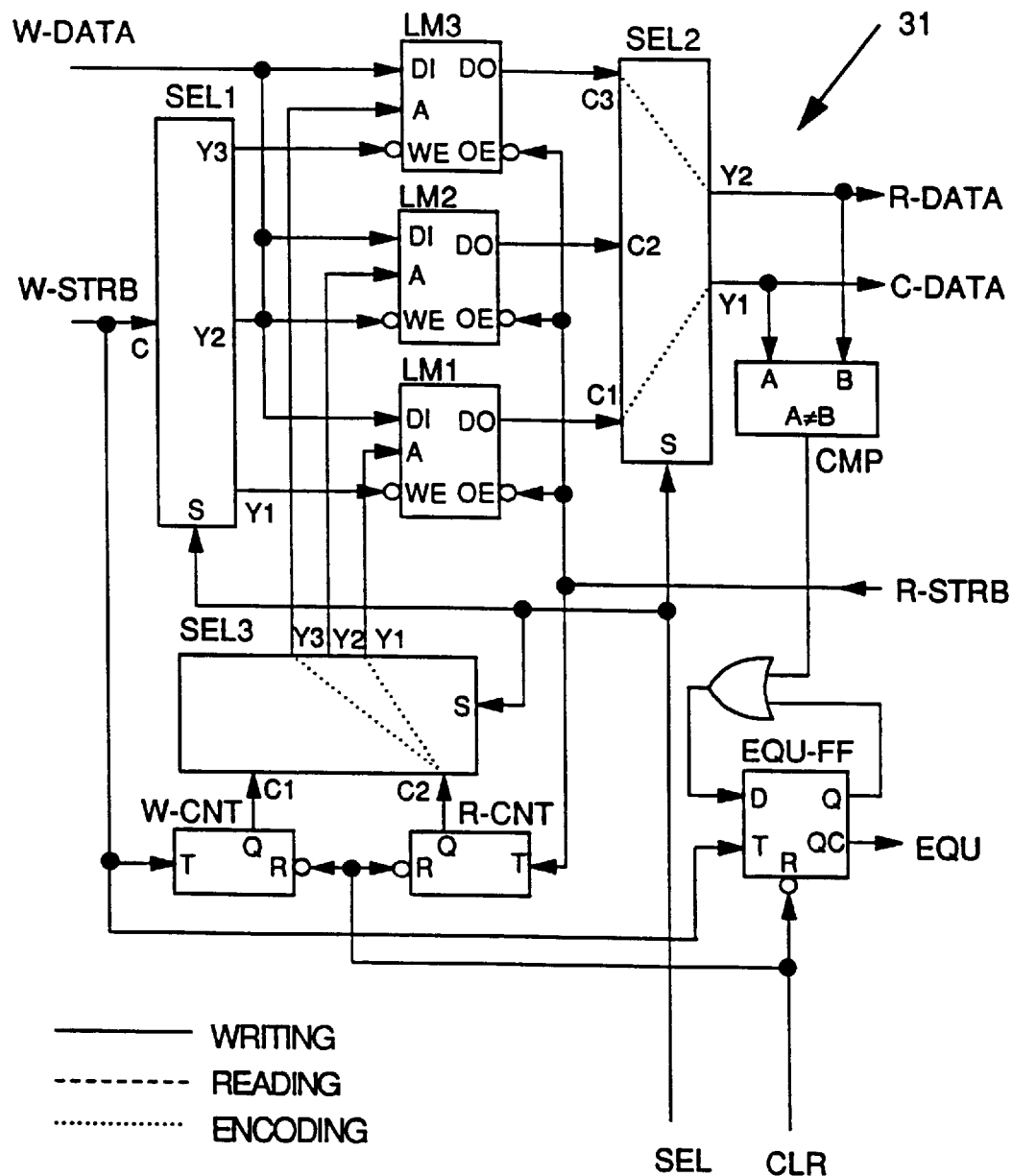
FIG. 15 is an operation block diagram of a line memory circuit at a third timing-chart partition of a conventional line memory circuit.

In FIG. 1, signals W-REQ, R-REQ, W-ACK and R-ACK are different from the conventional device of FIG. 11. These signals are explained in detail using FIG. 2. In the present invention, input B inputted into the comparator CMP is connected with an input picture element data W-DATA, SEL3 is switched by an input signal of W-STRB, and an arbitration circuit ARBT is supplied in addition which arbitrates a writing-in and reading-out of the line memory. As shown in FIG. 6, a process speed is improved in the present invention, since a line memory writing process and a line data comparing process are carried out at the same time.

As shown in FIG. 6, a continuous line process of the present invention is divided into the following two partitions.

Figure 4:
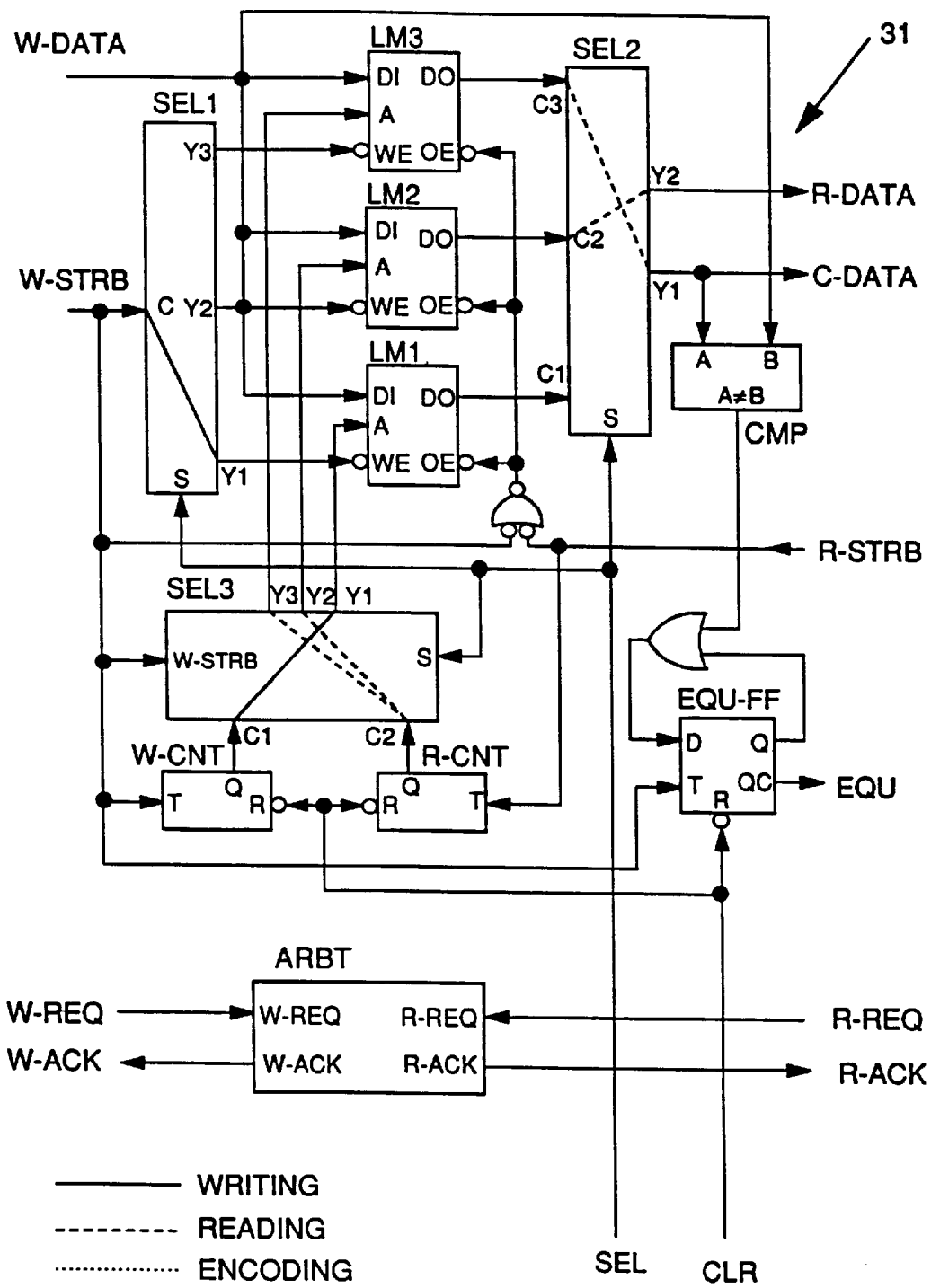
FIG. 4 is an operation block diagram of a line memory circuit at a first timing-chart partition of an embodiment of the present invention.

First partition (FIG. 4):

FIG. 4 is an operation block diagram of a line memory circuit at a first timing-chart partition of an embodiment of the present invention. In FIG. 4, C1 is connected with Y1, and C2 is connected with Y2 and Y3 in SEL3, but C1 is connected with Y3 during W-STRB is outputted (low level). Also, C3 is connected with Y1 and C2 is connected with Y2 in SEL2. C is connected with Y1 in SEL1.

When a signal W-REQ, which requests writing of a picture element data, is inputted from the outside reading circuit 2, the arbitration circuit ARBT recognizes it and outputs a writing acknowledged signal W-ACK. When W-ACK is returned to the reading circuit 2, W-STRB is outputted from the reading circuit 2 to the encoding circuit 3. The encoding circuit 3 outputs a picture element data (L1) on W-DATA of line 1 which is written in the line memory LM1.

On the other hand, while W-STRB is outputted, picture element data (L3), which are stored in the preceding line memory LM3 of line 3, are read out to the terminal A of the comparator CMP. Data (L1) of current line 1 on W-DATA are read out to the terminal B of the comparator CMP. The comparator CMP detects a match/mismatch status of data between (L3) and (L1).

At the same time, a current data (L1) on W-DATA is written into the line memory LM1. Thus, in the first partition, a writing process of data (L1) into the first line memory LM1 and a comparison process between the current input picture element data (L1) with the picture element data (L3) of the preceding line are carried out at the same time.

Figure 5:
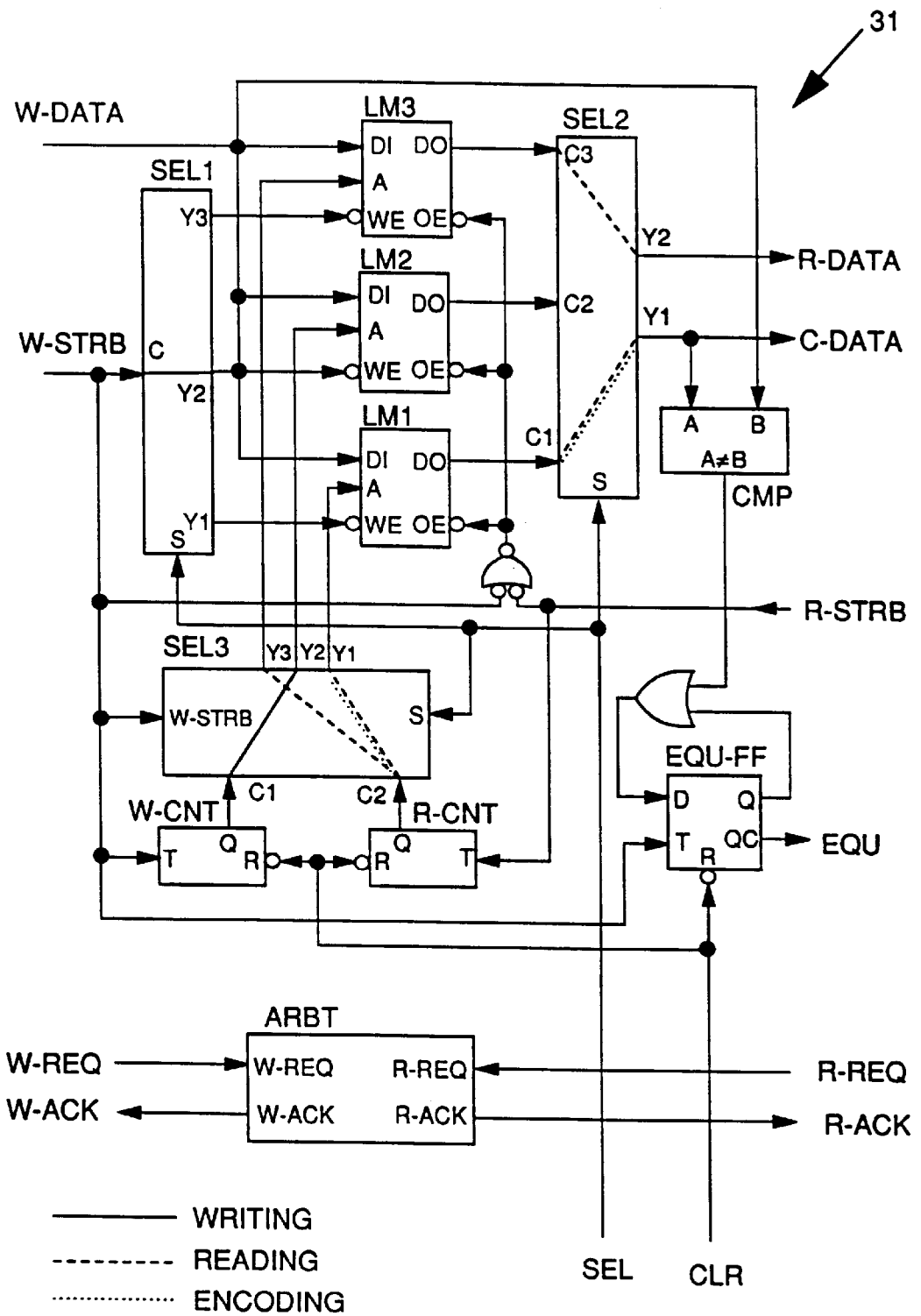
FIG. 5 is an operation block diagram of a line memory circuit at a second timing-chart partition of an embodiment of the present invention.

Second partition (FIG. 5):

FIG. 5 is an operation block diagram of a line memory circuit at a second timing-chart partition of an embodiment of the present invention. In FIG. 5, C1 is connected with Y2 and C2 is connected with Y3 and Y1 in SEL 3, but C1 is connected with Y1 during W-STRB being outputted (a low level) in SEL 3. C1 is connected with Y1 and C3 with Y2 in SEL2.

According to the connection described above, the following three operations are carried out at the same time. That is, the above three operations are, an operation for writing input picture element data (L2) currently scanned into a line memory LM2, an operation for comparing the current input picture element with picture element data (L1) of the preceding line, and an operation for encoding the preceding picture element data (L1) in reference to picture element data (L3) on the reference line.

Here in the second partition, W-REQ, W-ACK and W-STRB are the same as those in the first partition. But when a read out request W-REQ of picture element data are inputted from the encoder 32, the arbitration circuit ARBT arbitrates between W-REQ and W-ACK and it turns back an acknowledged signal W-ACK or R-ACK to one of them.

FIG. 3 shows an operation logic of ARBT in line memory circuit in an embodiment of the present invention.

When either W-REQ or R-REQ is inputted into ARBT circuit, W-ACK or R-ACK is outputted, respectively. When both W-REQ and R-REQ are inputted at the same time, a priority is, for example, given to W-REQ and W-ACK is outputted. It is of course possible to give a priority to R-REQ to output R-ACK when W-REQ and R-REQ are conflicted. Element data input process of the next line and comparison process are carried out. On the other hand, when R-ACK is returned, R-STRB is outputted, and then encoding process are carried out.

As described above, a line encoding process, line memory writing process and line data comparing process are carried out during one partition (in the second partition).

In the third first partition of FIG. 6, a writing operation of input picture element data (L3) into the line memory LM3 and a comparing operation of input picture element data (L3) with picture element data (L2) of the preceding line are carried out. Further, when the picture element data of the lines (L2=L1) compared in the second partition are matched, a line match/mismatch bit "1" is outputted from EQU and the line match/mismatch bit "1" is encoded in the encoder 32. In this case, the line picture element data (L2) is not encoded.

As described above, since a line memory writing process, a line data comparing process and a line encoding process can be carried out at the same time in the present invention, it is possible to improve the speed of total encoding processes.

In the present invention, it is possible to set freely the bit width of line memories LM1~LM3, such as, for example, a bit width of 8 bits (for 8 picture elements) or 16 bits (for 16 picture elements). The wider the bit width, the less the access numbers to the line memory are needed. Since it is possible to avoid the chances for collision of writing and reading in/out the arbitration circuit ARBT, waiting time is reduced and the high speed process can be obtained.

What is claimed is:

1. A line memory circuit, which has an information bit line match/mismatch bit encoded at the head of each line in said line memory circuit used in an encoding circuit, comprising:

a line memory for storing input picture element data of an i-th line;

a comparator for sequentially comparing picture element data of the i-th line with preceding picture data of an (i−1)th line, a match/mismatch bit generating circuit for generating match/mismatch bits which indicate whether contents of the i-th line matches with contents of the (i−1)th line or not;

an encoding circuit for encoding picture element data on the (i−1)th line according to the preceding matching result generated by the match/mismatch bit generating circuit when the contents of the (i−1)th line and the contents of the (i−2)th line are mismatched:

wherein said storing operation of the input picture element data of i-th line into the line memory, said comparing operation of the picture element data of the i-th line with the picture data of the (i−1)th line, and said encoding operation of the picture element data of the (i−1)th line are carried out during storing the i-th line of the picture data.

2. A line memory circuit of claim 1, further comprising an arbitration circuit for arbitrating a first request for storing input picture element data into the line memory with a second request for reading and encoding picture element data stored in the line memory, and then for carrying out an access control of the line memory so that a priority is given to one of the first and second requests when the first and second requests occur simultaneously.

3. A line memory circuit of claim 2, wherein the comparing operation of said comparator is carried out after the arbitration circuit gives a permission to input the picture element and also when the picture element data are stored into the line memory.

4. A line memory circuit of claim 3, wherein said comparator sequentially compares picture element data on the i-th line with picture element data on the (i−1)th line while the picture element data of the i-th line is input so that a comparison between the picture element data of the i-th line and the picture element data of the (i−1)th line is completed when all picture element data of the i-th line are stored in the line memory.

5. A line memory circuit of claim 2, wherein said comparator sequentially compares picture element data on the i-th line with picture element data on the (i−1)th line while the picture element data of the i-th line is input so that a comparison between the picture element data of the i-th line and the picture element data of the (i−1)th line is completed when all picture element data of i-th line are stored in the line memory.

6. A line memory circuit of claim 1, wherein the comparing operation of said comparator is carried out after an arbitration circuit gives a permission to input the picture element and also when the picture element data are stored into the line memory.

7. A line memory circuit of claim 6, wherein said comparator sequentially compares picture element data on the i-th line with picture element data on the (i−1)th line while the picture element data of i-th line is input so that a comparison between the picture element data of the i-th line and the picture element data of the (i−1)th line is completed when all picture element data of the i-th line are stored in the line memory.

8. A line memory circuit of claim 1, wherein said comparator sequentially compares picture element data on the i-th line with picture element data on the (i−1)th line while picture element data of the i-th line is input so that a comparison between the picture element data of the i-th line and the picture element data the (i−1)th line is completed when all picture element data of the i-th line are stored in the line memory.

9. A line memory circuit comprising:

a plurality of line memories for storing input picture element data;

a first selector for selecting a line memory from the plurality of line memories for storing input picture element data;

a second selector for selectively outputting data stored in the selected line memory;

a third selector for providing addresses of the selected line memory;

a comparator for receiving data output from the second selector and for comparing current data with the data read out from the second selector;

a line match/mismatch bit generator for generating line match/mismatch bits in response to a result of said comparator, said plurality line memories having an information line match/mismatch encoded at a head of each line;

an encoder for encoding picture elements data, wherein encoding of the picture element data of the selected line is avoided when a matching result is obtained, wherein a first input of said comparator is connected with an input picture element data terminal, a second input of said comparator is connected with an output of the second selector, and the third selector is controlled by a writing timing of input picture element data to the selected line memory.

10. A line memory circuit of claim 9, further comprising an arbitration circuit, wherein said arbitration circuit gives a priority to a request when a first request for storing input picture element data into a line memory and a second request for reading and encoding picture element data stored in a line memory are simultaneously input.

* * * * *